(12) United States Patent
Jeong

(10) Patent No.: US 7,727,684 B2
(45) Date of Patent: Jun. 1, 2010

(54) MASK AND MANUFACTURING METHOD THEREOF

(75) Inventor: Soo Kyeong Jeong, Chungcheongbuk-do (KR)

(73) Assignee: Hynix Semiconductor Inc., Icheon-si (KR)

( * ) Notice: Subject to any disclaimer, the term of this patent is extended or adjusted under 35 U.S.C. 154(b) by 184 days.

(21) Appl. No.: 11/958,523

(22) Filed: Dec. 18, 2007

(65) Prior Publication Data

US 2008/0286663 A1  Nov. 20, 2008

(30) Foreign Application Priority Data

May 15, 2007  (KR) ...................... 10-2007-0047326

(51) Int. Cl.
*G03F 1/00* (2006.01)
(52) U.S. Cl. .......................................... 430/5; 524/434
(58) Field of Classification Search ...................... 430/5, 430/311–315; 524/434
See application file for complete search history.

(56) References Cited

U.S. PATENT DOCUMENTS 7,094,503 B2 *  8/2006  Ray et al. ...................... 430/5

2001/0044077 A1 *  11/2001  Tan ............................ 430/315
2004/0019143 A1 *  1/2004  Koloski et al. ............... 524/434
2006/0155035 A1  7/2006  Metzemacher et al.
2007/0012189 A1  1/2007  Kang et al.

FOREIGN PATENT DOCUMENTS

| KR | 10-2005-0123264 | 12/2005 |
| KR | 10-2006-0069602 | 6/2006 |
| WO | WO 2006/105273 | 10/2006 |

* cited by examiner

*Primary Examiner*—Mark F Huff
*Assistant Examiner*—Stewart A Fraser
(74) *Attorney, Agent, or Firm*—Marshall, Gerstein & Borun LLP

(57) ABSTRACT

A blank mask is provided. The blank mask includes a mask layer disposed on a transparent quartz substrate, and a nano inorganic material-polymer complex layer. The nano inorganic material-polymer complex layer has nano-scale components and is formed on a surface of the mask layer to adsorb a residual contamination source remaining on the surface of the mask layer and to protect the surface of the mask layer from external contamination sources. The nano inorganic material-polymer complex layer can include a nano clay-polymer composite where PVDF is interposed between the nano clay plate-shaped layers. The contamination sources can be removed from the mask layer surface by removing the composite layer.

12 Claims, 5 Drawing Sheets

MASK AND MANUFACTURING METHOD THEREOF

CROSS-REFERENCE TO RELATED APPLICATION

Priority to Korean application number 10-2007-0047326 filed on May 15, 2007, which is incorporated by reference in its entirety, is claimed.

BACKGROUND OF THE INVENTION

1. Field of the Invention

The invention relates to a semiconductor device, and more particularly, to a blank mask and a manufacturing method thereof.

2. Brief Description of Related Technology

A mask is used during a process of transferring patterns for a semiconductor device onto a wafer. A mask is manufactured by forming mask patterns having a layout of patterns to be transferred to a transparent substrate. Such a mask is manufactured by performing a patterning process for mask patterns on a blank mask including a layer for the mask patterns formed on the transparent substrate. The blank mask may be maintained in a state where any defect is not substantially generated before patterning of a mask layer is performed.

When packed or otherwise stored prior to use, it is frequently the case that foreign substances accumulate and are absorbed onto the surface of the blank mask, thereby generating defects during a subsequent process. To suppress this defect generation, a pre-inspection and washing to remove foreign substances upon detection of the foreign substances are performed before a patterning process is performed on the blank mask. However, the inspection and washing processes increase process time, which lowers productivity of the entire mask manufacturing process. Also, when defects are generated during the inspection process after mask manufacturing, a valuable mask is lost. Therefore, it is very important to remove foreign substances or particles from an initial blank mask.

SUMMARY OF THE INVENTION

Embodiments of the invention are directed to a blank mask structure that can suppress the adsorption of foreign substances on a surface of a blank mask and defect generation during a subsequent mask manufacturing process, and a manufacturing method of the blank mask.

In one embodiment, a blank mask includes: a transparent quartz substrate; a mask layer disposed on the substrate; and a nano inorganic material-polymer complex layer coated on a surface of the mask layer to adsorb a residual contamination source remaining on the surface of the mask layer and protect the surface of the mask layer from external contamination sources.

The nano inorganic material-polymer complex layer may include a nano clay-polymer composite where polyvinylidene fluoride (PVDF) is interposed between nano clay plate-shaped layers, or may include the nano clay in an amount of 5 weight % or less relative to the PVDF.

In another embodiment, a method for manufacturing a blank mask includes: dissolving a polymer in a first polar solvent to prepare a polymer solution; dispersing nano inorganic materials in a second polar solvent to prepare a dispersed nano inorganic material solution; mixing the polymer solution with the dispersed nano inorganic material solution to form a nano inorganic material-polymer complex solution; and coating the nano inorganic material-polymer complex solution on a mask layer formed on a transparent quartz substrate to form a nano inorganic material-polymer complex layer adsorbing residual contamination sources remaining on a surface of the mask layer and protecting the surface of the mask layer from external contamination sources.

Preferably, the polymer includes polyvinylidene (PVDF) and the first polar solvent includes dimethyl formamide (DMF); the nano inorganic materials include a nano clay and the second polar solvent includes DMF; and, the step of dispersing nano inorganic materials further includes adding the nano clay to the DMF and then stirring the nano clay in the DMF.

Preferably, the step of mixing the polymer solution with the dispersed nano inorganic material solution further includes stirring the mixture of the polymer solution with the dispersed nano inorganic material solution; and, applying ultrasonic waves to the mixture of the polymer solution with the dispersed nano inorganic material solution.

The method preferably further includes removing the nano inorganic material-polymer complex layer. This layer is removed by heating the coated substrate and the mask layer at a sub-atmospheric pressure to a temperature of about 25° C. to about 100° C., thereby releasing the nano inorganic material-polymer complex layer from the mask layer.

An embodiment of the invention provides a structure including a nano clay-polymer complex layer coated on a surface of a blank mask to block contaminant factors that originate from outside environments. The nano clay-polymer complex layer is removed from the surface of the blank mask before a process of patterning a mask layer of the blank mask. Contaminant sources such as particles already existing on the surface of the blank mask can be adsorbed and removed while the nano clay-polymer complex layer is removed. Therefore, contaminants that may be generated on the surface of the blank mask, such as particles, can be removed initially, so that defect generation during a subsequent process can be suppressed and contamination of the mask can be suppressed.

DESCRIPTION OF SPECIFIC EMBODIMENTS

Hereinafter, a mask and a manufacturing method thereof in accordance with the present invention will be described in detail with reference to the accompanying drawings.

Figure 1:
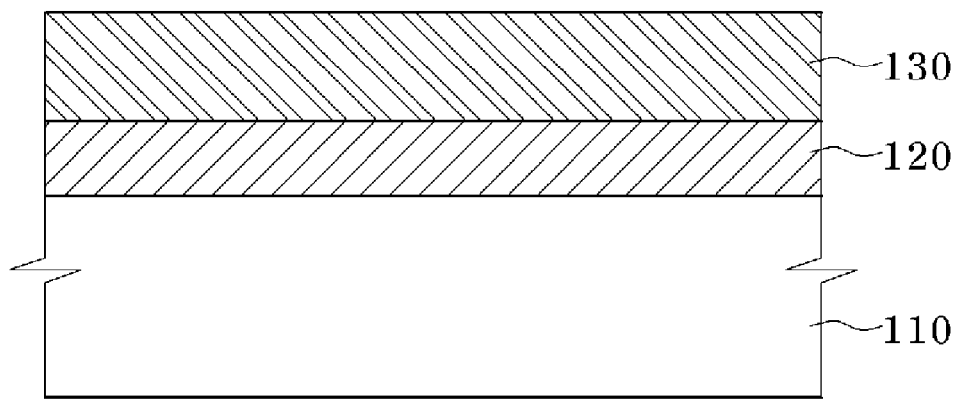
FIGS. 1 to 3 illustrate schematic cross-sectional views of a mask according to an embodiment of the invention.

Referring to FIG. 1, a blank mask structure includes mask layers 120 and 130 formed on a transparent substrate 110 made of quartz. The mask layers 120 and 130 are to be patterned as mask patterns during a subsequent process. The mask layers 120 and 130 can change depending on a mask structure to be formed. For example, in a phase shift mask (PSM), a layer of MoSiN is formed as a phase shift layer 120, and a Cr layer is formed as a light blocking layer 130, so that a mask layer can be formed.

Figure 2:
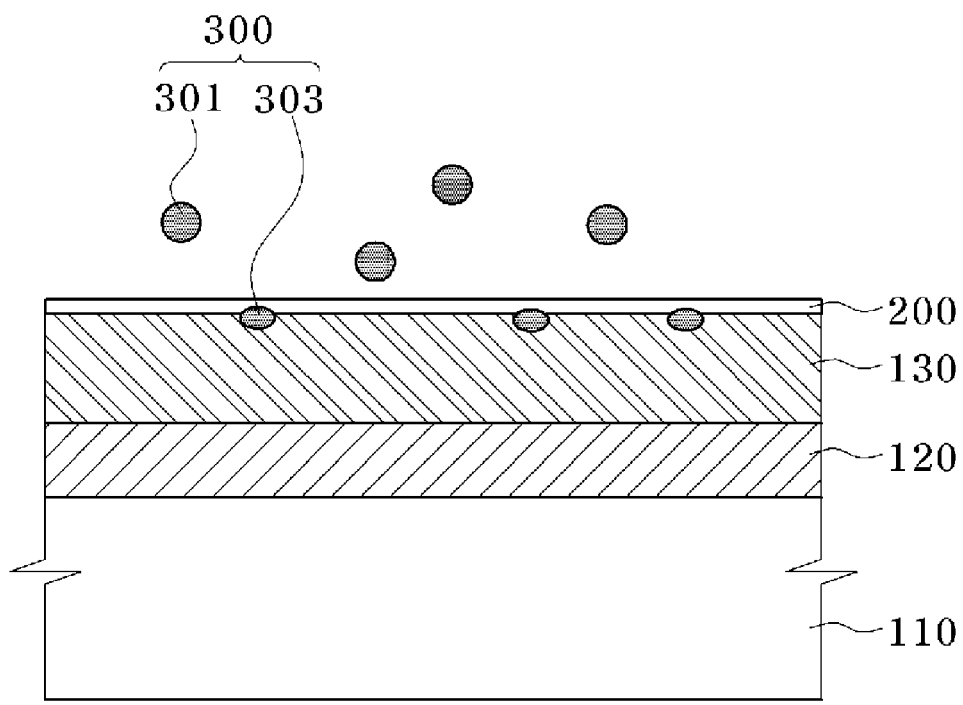

Referring to FIG. 2, a nano clay-polymer composite layer 200 is coated on the surface of the blank mask having the above-described structure, for example, the surface of the light blocking layer 130. The nano clay-polymer composite layer 200 suppresses adsorption of external contamination sources 301 on the surface of the light blocking layer 130, and adsorbs residual contaminants 303 that may exist on the surface of the light blocking layer 130, thereby suppressing the adsorption of the external and residual contamination 301 and 303 (collectively contamination sources 300) on the surface of the light blocking layer 130.

Figure 3:
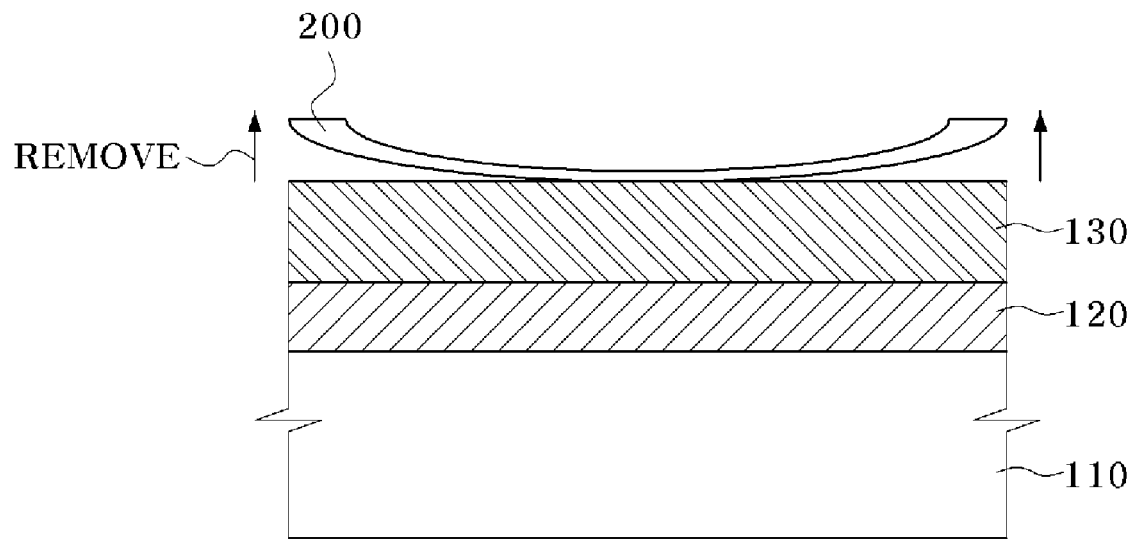

Referring to FIG. 3, the nano clay-polymer composite layer 200 is removed from the surface before a patterning process is performed on the mask layers 120 and 130. At this point, the nano clay-polymer composite layer 200 can be removed with relative ease because the adhesive force of the nano clay-polymer composite layer 200 diminishes when the blank mask is heated and the temperature increases. As the nano clay-polymer composite layer 200 is removed, the contamination sources 300 (of FIG. 2) adsorbed on the nano clay-polymer composite layer 200 are removed from the blank mask along with the nano clay-polymer composite. Accordingly, the surface of the light blocking layer 130 maintains a clean surface in the absence of the contamination sources 300. Therefore, a separate pre-inspection step to search for the contamination sources 300 or other foreign substances on the surface of the light blocking layer 130 can be omitted, as can a separate washing process for removing the same.

Figure 4:
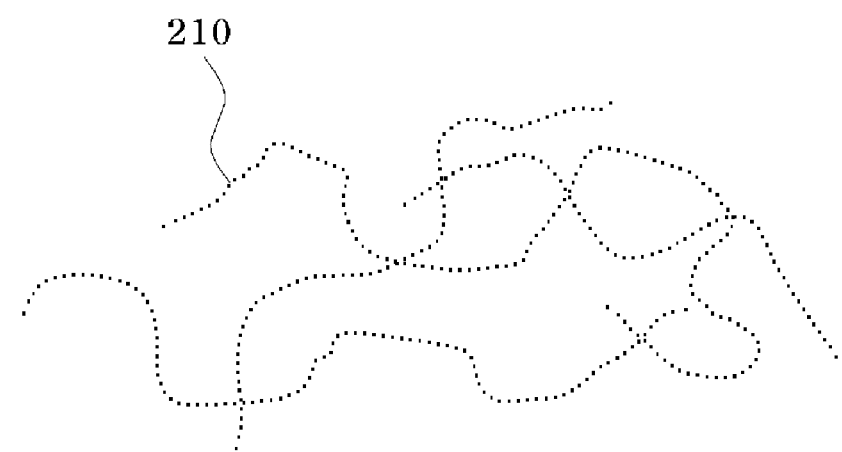
FIGS. 4 to 10 illustrate schematic views of a nano clay-polymer complex layer of a mask according to an embodiment of the invention.
Figure 5:
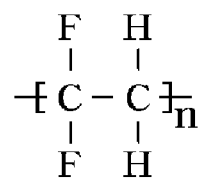

The nano clay-polymer composite layer 200 introduced in an embodiment of the invention is proposed in consideration of its stability with respect to various environmental factors, for example, its resistance to heat, deformation, and moisture ($H_2O$), as well as its ability to adsorb foreign substances and contamination sources 300. Referring to FIG. 4, a polymer material that can be used for a polymer 210 used as a supporting body in the nano clay-polymer composite layer 200 preferably includes a polymer material having relatively high degree of crystallinity (which corresponds to comparatively favorable thermal and mechanical properties), and having a relatively strong hydrophobicity (which increases the resistance to moisture contained in atmosphere even when exposed to the atmosphere). An embodiment of the invention uses polyvinylidene fluoride (PVDF) as the polymer 210, which has been determined to possess such crystalline and hydrophobic characteristics as a result of experimental tests. PVDF is represented by the chemical formula repeating unit shown in FIG. 5.

Meanwhile, in order to effectively adsorb the contamination sources 300 (of FIG. 2), a composite can be configured to include nano inorganic materials such as $SiO_2$, $TiO_2$, $BaTiO_3$, and nano clays exhibiting substantial electrostatic attraction. The nano inorganic material preferably is an inorganic material having a size on the order of nanometers (nm), for example, a size of several nm to several hundred nm, or about 5 nm to about 500 nm, preferably a mean size of about 200 nm. Because nano clays formed from these nano inorganic materials can increase the adhesive force with respect to various contamination sources 300, the nano clay is a preferred component of the composite 200 according to an embodiment of the invention.

Figure 6:
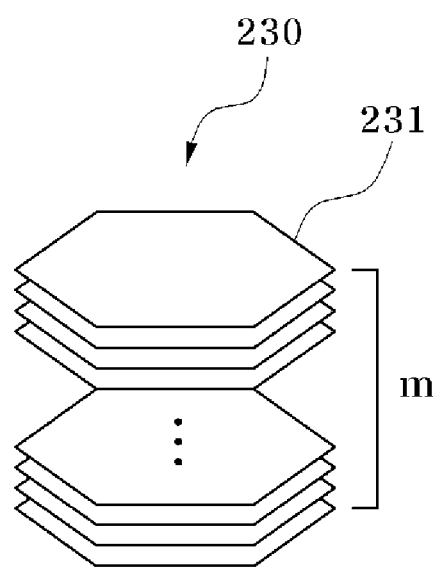
Figure 7:
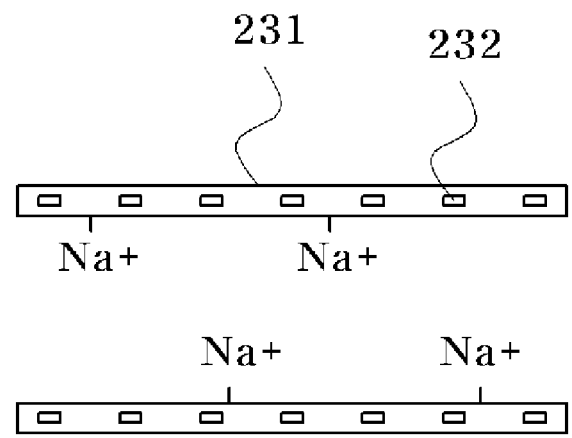

Referring to FIGS. 6 and 7, it is known that a nano clay 230 has a thin layered structure in which hundreds to thousands of plate-shaped layers 231 are stacked by van der Walls forces. The nano clay 230 has an aspect ratio of approximately 100 to approximately 1000 depending on its variety. Each plate-shaped layer 231 includes uniformly distributed negative (−) charges 232 and $Na^+$ charges which change the substance surface via ion exchange. When the $Na^+$ charge is exchanged with a hydrocarbon (C—H) chain, the affinity of the resulting substance to polymer materials having a chain back bone can be increased.

Figure 8:
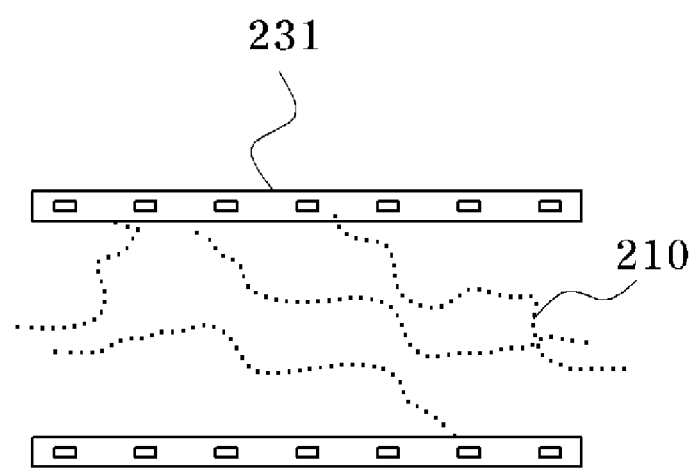
Figure 9:
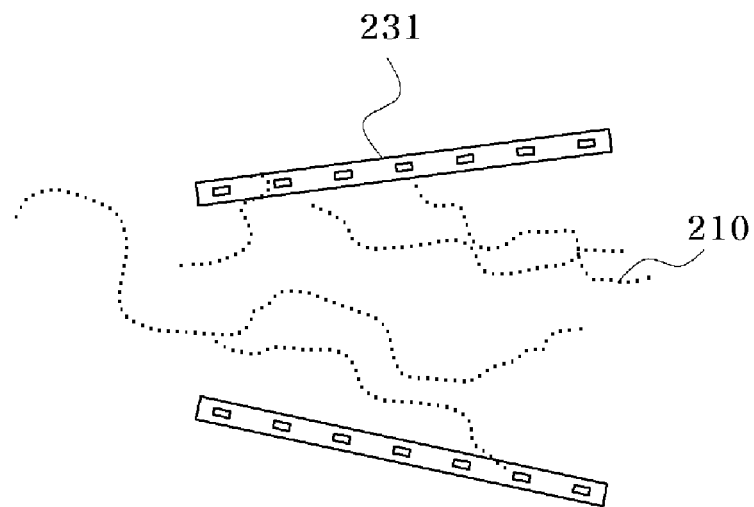
Figure 10:
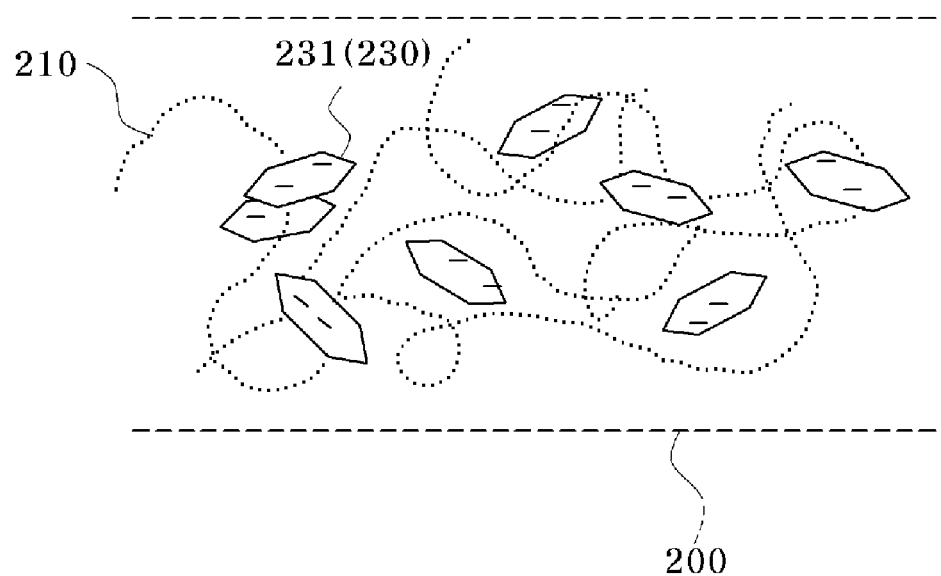

Accordingly, the polymer 210 is substantially uniformly distributed between nano clay plate-shaped layers 231 as illustrated in FIG. 8. This configuration tends to increase the distance between the nano clay plate-shaped layers 231 even further as illustrated in FIG. 9. Therefore, referring to FIG. 10, the nano clay 230 is substantially dispersed throughout the nano clay-polymer composite layer 200 and individual layers are substantially spread apart relative to their natural state.

Because the plate-shaped layers 231 of the nano clay 230 are more extended or spread apart due to the insertion of the polymer 210, the effective area of the nano clay 230 that is substantially exposed to an outside environment increases. Accordingly, interactions between the surface of the nano clay 230 and the outside contamination sources 300 (of FIG. 2) can take place more easily, thus increasing the surface adsorption capability of the nano clay 230. That is, the nano clay 230 can be more uniformly dispersed throughout the composite 200, so that the effective areas of the plate-shaped layers 231 having surface charges increase, which increases the probability of reacting with the outside contamination sources 300 or organic materials. Accordingly, the adsorption efficiency of the outside contamination sources 300 or organic materials also increases.

To form a nano clay-polymer composite layer 200 (of FIG. 2) according to an embodiment of the invention, a nano clay-polymer composite solution is first prepared. At this point, a polar solvent having relatively excellent solvency with respect to the polymer 210 (e.g., PVDF), and having an advantage in dispersing the nano clay 230 is selected as the solvent. In an embodiment, dimethyl formamide (DMF), is used as the polar solvent. For example, PVDF is first dissolved in DMF for approximately two hours to make a PVDF-DMF solution. The PVDF-DMF solution is prepared with a weight ratio of about 1(PVDF):3(DMF). The PVDF may be dissolved into the DMF to a concentration that the PVDF-DMF solution can be coated as a flim. Also, a dispersed nano clay solution of approximately 3 weight % is prepared. For example, nano clay (3 g) is added to DMF (97 g), and is dispersed on a hot plate at approximately 40° C. for 48 hours by stirring.

After that, the dispersed nano clay solution is mixed with the PVDF solution. At this point, the nano clay content is preferably about 5 wt % relative to the PVDF content. This mixing process includes a process of stirring for approximately 24 hours. At this point, a reaction flask containing the mixed solution is placed into an ultrasonic bath so that the physical force of the ultrasonic waves is applied to the mixed solution for several minutes and the nano clay becomes dispersed in the PVDF solution.

As the length of the hydrocarbon organic material (i.e., polymer 210) replacing the $Na^+$ ion on the surface the plate-shaped layers 231 (of FIG. 10) of nano clay 230 increases, the hydrophobicity of the mixture increases. Therefore, because the affinity to PVDF, which is hydrophobic, increases, the insertion of additional PVDF between the plate-shaped layers 231 is more easily performed, so that a uniform distribution of PVDF can be achieved. The extent of the dispersion can be checked using an X-ray diffractometer (XRD) or a transmission electron microscope (TEM). Nano clay has a structural characteristic that the extent of dispersion decreases as the content of the nano clay increases. Accordingly, the electrostatic effect of the surface for adsorbing surrounding contaminants or particles can be reduced. In an embodiment, nano clay is dispersed at a ratio of 5 wt % with respect to PVDF content or less.

The above-manufactured nano clay-polymer composite solution is then coated on the surface of the blank mask, for example, the surface of the light blocking layer 130 (of FIG. 2), preferably using spin coating equipment. Preferably, the nano clay-polymer composite layer 200 (of FIG. 2) is formed to have a thickness of approximately 200 nm. When the nano clay-polymer composite layer 200 is heated to a temperature higher than room temperature (e.g., about 100° C.) at sub-atmospheric pressure (e.g., less than 1 atm absolute), for example in a vacuum chamber, the nano clay-polymer composite layer 200 is released from the mask layer 130 as illustrated in FIG. 3. Therefore, the nano clay-polymer composite layer 200 can be easily and neatly removed from the mask's surface.

According to an embodiment of the invention, a nano inorganic material-polymer composite layer is coated on a blank mask to suppress contamination originating from outside environments. Because the nano inorganic material-polymer composite layer includes a nano inorganic material, for example, nano clay having an adsorption force with respect to foreign substances, defects or contaminants to which the blank mask is susceptible can be removed before a mask patterning process. Therefore, additional washing and contaminant-inspection processes for preventing contamination caused by foreign substances can be omitted. Also, defect generation during a subsequent patterning process that is caused by contamination with foreign substances is suppressed, so that waste by defects after mask manufacturing is reduced.

While the invention has been described with respect to the specific embodiments, it will be apparent to those skilled in the art that various changes and modifications may be made without departing from the spirit and scope of the invention as defined in the following claims.

What is claimed is:

1. A blank mask, comprising:
   a transparent quartz substrate;
   a mask layer disposed on the substrate, the mask layer comprising a Cr layer; and
   a nano clay-polymer complex layer coated directly on a surface of the Cr layer to adsorb residual contamination sources remaining on the surface of the Cr layer and to protect the surface of the Cr layer from external contamination sources, the nano clay-polymer complex comprising a composite in which a polymer is interposed between plate-shaped nano clay layers.

2. The blank mask of claim 1, the polymer comprises polyvinylidene fluoride (PVDF).

3. The blank mask of claim 1, wherein the nano clay-polymer complex layer comprises the nano clay in an amount of 5 weight % or less relative to the polymer.

4. A method for manufacturing a blank mask, the method comprising:
   dissolving a polymer in a first polar solvent to prepare a polymer solution;
   dispersing nano clay in a second polar solvent to prepare a dispersed nano clay solution;
   mixing the polymer solution with the dispersed nano clay solution to form a nano clay-polymer complex solution;
   coating the nano clay-polymer complex solution directly on a Cr layer of a mask layer formed on a transparent quartz substrate to form a nano clay-polymer complex layer adsorbing residual contamination sources remaining on a surface of the Cr layer and protecting the surface of the Cr layer from external contamination sources, the nano clay-polymer complex comprising a composite in which a polymer is interposed between plate-shaped nano clay layers; and
   removing the nano clay-polymer complex layer from the Cr layer.

5. The method of claim 4, wherein the polymer comprises polyvinylidene fluoride (PVDF) and the first polar solvent comprises dimethyl formamide (DMF);
   the second polar solvent comprises DMF, and
   dispersing the nano clay comprises adding the nano clay to the DMF and then stirring nano clay in the DMF.

6. The method of claim 5, comprising mixing the polymer solution with the dispersed nano clay by:
   stirring the mixture of the polymer solution with the dispersed nano clay; and,
   applying ultrasonic waves to the mixture of the polymer solution with the dispersed nano clay solution.

7. The method of claim 4, comprising removing the nano clay-polymer complex layer from the Cr layer by heating the coated substrate and mask layer at a sub-atmospheric pressure to a temperature of about 100° C.

8. A method for manufacturing a mask, the method comprising:
   forming a nano clay-polymer composite layer directly on a Cr layer of a mask layer to protect a surface of the Cr layer from external contamination sources, the mask layer being formed on a transparent quartz substrate, the nano clay-polymer complex comprising a composite in which a polymer is interposed between plate-shaped nano clay layers;
   removing the nano clay-polymer composite layer from the surface of the Cr layer; and
   selectively etching the mask layer to pattern the mask layer.

9. The method of claim 8, comprising forming the nano clay-polymer composite layer by:
   dissolving the polymer in a first polar solvent to prepare a polymer solution;
   dispersing the nano clay in a second polar solvent to prepare a dispersed nano clay solution;
   mixing the polymer solution with the dispersed nano clay solution to form a nano clay-polymer complex solution; and
   coating the nano clay-polymer complex solution on the mask layer.

10. The method of claim 9, wherein the polymer comprises polyvinylidene fluoride (PVDF) and the first polar solvent comprises dimethyl formamide (DMF);
    the second polar solvent comprises DMF; and,
    dispersing the nano clay comprises adding the nano clay to the DMF and then stirring nano clay in the DMF.

11. The method of claim 10, comprising mixing the polymer solution with the dispersed nano clay solution by:
    stirring the mixture of the polymer solution with the dispersed nano clay solution; and,
    applying ultrasonic waves to the mixture of the polymer solution with the dispersed nano clay solution.

12. The method of claim 8, comprising removing the nano clay-polymer complex layer by heating the coated substrate and mask layer at a sub-atmospheric pressure to a temperature of about 25° C. to about 100° C., thereby releasing the nano clay-polymer complex layer from the mask layer.

* * * * *